United States Patent
Ker et al.

(10) Patent No.: US 6,927,602 B2
(45) Date of Patent: Aug. 9, 2005

(54) MIXED-VOLTAGE CMOS I/O BUFFER WITH THIN OXIDE DEVICE AND DYNAMIC N-WELL BIAS CIRCUIT

(75) Inventors: Ming-Dou Ker, Hsinchu (TW); Chia-Sheng Tsai, Taichung (TW); Che-Hao Chuang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 79 days.

(21) Appl. No.: 10/626,601

(22) Filed: Jul. 25, 2003

(65) Prior Publication Data

US 2005/0017754 A1 Jan. 27, 2005

(51) Int. Cl.$^7$ .................................. H03K 19/094
(52) U.S. Cl. .................... 326/81; 326/58; 327/534
(58) Field of Search .......................... 326/80–83, 86, 326/57–58; 327/534

(56) References Cited

U.S. PATENT DOCUMENTS

| | | | |
|---|---|---|---|
| 5,864,243 A | | 1/1999 | Chen et al. ............... 326/58 |
| 5,926,056 A | * | 7/1999 | Morris et al. ............. 327/333 |
| 6,060,906 A | * | 5/2000 | Chow et al. .............. 326/81 |
| 6,313,671 B1 | * | 11/2001 | Le et al. .................. 327/112 |
| 6,313,672 B1 | * | 11/2001 | Ajit et al. ................. 327/112 |

OTHER PUBLICATIONS

Marcel J. M. Pelgrom and E. Carel Dijkmans, "A 3/5 V Compatible I/O Buffer," IEEE Journal of Solid–State Circuits, vol. 30, No. 7, Jul. 1995, pp. 823–825.

M. Takahashi; T. Sakurai, K. Sawada, K. Nogami, M. Ichida, and K. Matsuda, "3.3V–5V Compatible I/O Circuit Without Thick Gate Oxide," Proc. of IEEE Custom Integrated Circuits Conference, 1992, May pp. 23.3.1–23.3.4.

G. Singh and R. Salem, "High–Voltage Tolerant I/O Buffers With Low–Voltage CMOS Process," IEEE Journal of Solid–State Circuits, vol. 34, No. 11, 1999, pp. 1512–1525, Nov. 1999.

Deng–Yuan Chen, "Design of a Mixed 3.3V and 5V PCI I/O Buffer," Proc. of ASIC, 1996, pp. 336–339, no month.

* cited by examiner

Primary Examiner—James H. Cho
(74) Attorney, Agent, or Firm—Akin Gump Strauss Hauer & Feld, LLP (57) ABSTRACT

A buffer circuit on a first chip coupled between a first circuit on the first chip and a second circuit on a second chip including a driver circuit comprising at least a first PMOS transistor and a second PMOS transistor, one of the source and drain of the second PMOS transistor being coupled to the substrate of the first PMOS transistor, wherein the second PMOS transistor is turned off when a first signal having a voltage level higher than a power supply voltage of the buffer circuit appears at the node, and a gate-tracking circuit coupled to provide a first bias and a second bias to the gate of the first PMOS transistor depending on the signal appearing at the node.

35 Claims, 5 Drawing Sheets

MIXED-VOLTAGE CMOS I/O BUFFER WITH THIN OXIDE DEVICE AND DYNAMIC N-WELL BIAS CIRCUIT

DESCRIPTION OF THE INVENTION

1 Field of the Invention

This invention relates in general to an input/output buffer circuit and, more particularly, to a mixed-voltage input/output buffer circuit without a dual oxide option and complex bias circuits.

2 Background of the Invention

In a large electronic system having multiple sub-systems, such as in a computer system, there are generally a plurality of power supplies providing different power levels. The sub-systems, such as integrated circuits (ICs) and chips in the system often require different power voltages. Therefore, to protect the sub-systems from being damaged by the different power voltages, a mixed-voltage input/output (I/O) buffer circuit is generally provided between the sub-systems.

For example, in a system having a first circuit on a first chip and a second circuit on a second chip with an I/O buffer circuit coupled therebetween, the buffer circuit operates in at least two operational modes. For purposes of the present description, it is assumed that a power supply of the first circuit has a lower voltage level than that of the second circuit and the I/O buffer circuit operates at the same power supply level as that of the first circuit. Thus, the first circuit and the I/O buffer circuit operate at a 1.8V or 2.5V and the second circuit operates at a power level of 3.3V or 5V. In addition, the I/O buffer circuit operates at a transmit mode and a receive mode. The I/O buffer circuits operates in the transmit mode when the buffer receives one or more signals from the first circuit and outputs one or more signals to the second circuit. The I/O buffer circuit operates in the receive mode when the buffer receives one or more signals from the second circuit and outputs one or more signals back to the first circuit. Ideally, the buffer circuit is expected to operate without errors in either mode. In the transmit mode, the buffer generally operates as expected. However, errors may occur when the buffer circuit operates in the receive mode. Such errors are explained with reference to FIG. 1.

Figure 1:
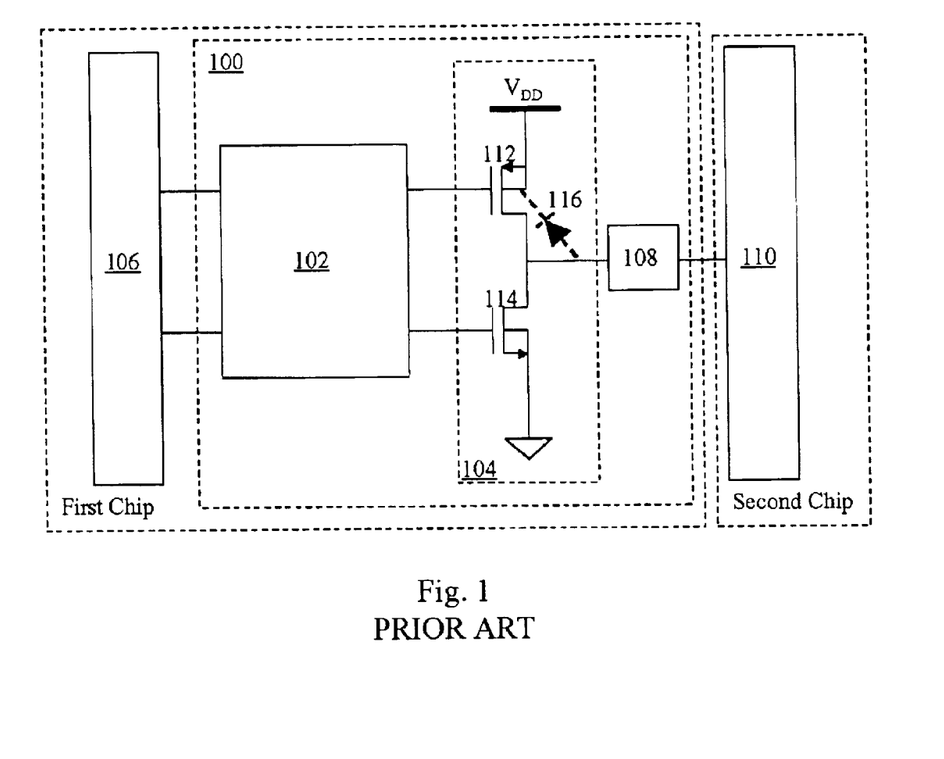
FIG. 1 is a block diagram of a conventional I/O buffer circuit.

FIG. 1 is a block diagram of a conventional buffer circuit 100 used in a mixed-voltage system (not numbered) including a first chip (not numbered) and a second chip (not numbered). The first chip includes buffer circuit 100 and a first circuit 106 coupled to buffer circuit 100. Buffer circuit 100 includes a logic circuit 102, a driver circuit 104 coupled to logic circuit 102, and a bonding pad 108 coupled to logic circuit 102. Driver circuit 104 includes a PMOS transistor 112 and an NMOS transistor 114, both of which are driven by logic circuit 102. The drain terminals (not numbered) of both PMOS transistor 112 and NMOS transistor 114 are coupled together and further coupled to bonding pad 108. Both the source (not numbered) and the substrate (not numbered) of PMOS transistor 112 are coupled to $V_{DD}$. A parasitic diode 116 is formed between the drain and substrate of PMOS transistor 112. Driver circuit 104 is coupled, through bonding pad 108, to a second circuit 110 provided in the second chip. Buffer circuit 100 has a power supply voltage $V_{DD}$ of 2.5V and second circuit 110 has a power supply voltage of 5V.

Buffer circuit 100 may encounter an operational error in the receive mode of driver circuit 104 when second circuit 110 outputs a logic "1", e.g., 5V, to bonding pad 108. Since PMOS transistor 112 has a drain voltage of 5V and a substrate, or n-well, voltage of 2.5V, the drain-substrate p-n junction of PMOS transistor 112 is forward biased, thereby causing a substantial current to flow through diode 116 from bonding pad 108 to $V_{DD}$. Furthermore, when bonding pad 108 is at 5V, while the gate of PMOS transistor 112 is at either 2.5V or 0V, PMOS transistor 112 is turned on due to the positive bias on the drain terminal with respect to the gate terminal. Therefore, current flows through transistor 112 from bonding pad 108 to the $V_{DD}$ terminal. Therefore, even when PMOS transistor 112 is supposed to be off, i.e., when buffer circuit 100 is operating in the receive mode, PMOS transistor 112 may be on and conducting current from bonding pad 108 to the $V_{DD}$ terminal.

Since the MOS transistors in first circuit 106 are designed for 2.5V operations, the transistors in buffer circuit 100, which is on the same chip as first circuit 106, are generally also designed for 2.5V operations to simplify the design and manufacturing process. During operation, the voltage drop across the gate oxide of the transistors of buffer circuit 100 should be generally no more than about 2.5V. However, when the voltage at bonding pad 108 is 5V in the receive mode, while the gate of NMOS transistor 114 is biased at 0V, the gate oxide of NMOS transistor 114 is subject to a 5V voltage drop, which may degrade or damage the gate oxide, thereby adversely affecting the operations of buffer circuit 100.

Figure 2:
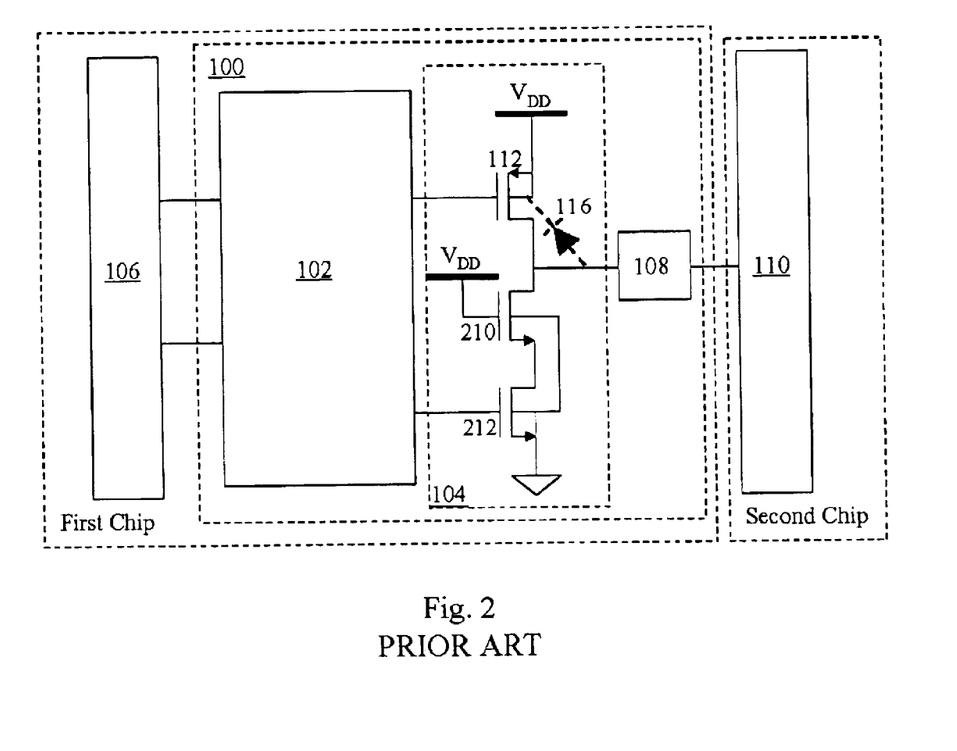
FIG. 2 is a block diagram of another conventional I/O buffer circuit.

A known alternative to the buffer circuit 100 shown in FIG. 1 is shown in FIG. 2. Referring to FIG. 2, stacked NMOS transistors 210 and 212 replace NMOS transistor 114. Therefore, when the voltage at bonding pad 108 is at 5V, while $V_{DD}$ is at 2.5V, the voltage drop across the gate oxide of NMOS transistor 210 is only 2.5V. As such, the gate oxide is less likely to be degraded or damaged.

SUMMARY OF THE INVENTION

Accordingly, the present invention is directed to mixed-voltage I/O circuit designs that obviate one or more of the problems due to limitations and disadvantages of the related art.

In accordance with the present invention, there is provided a buffer circuit in a mixed-voltage circuit operating in a power supply voltage that includes a node, a driver circuit coupled to the node comprising at least a first PMOS transistor having a substrate, a drain, a source, and a parasitic diode between the drain and the substrate, the driver circuit having an on-state and an off-state, and a second PMOS transistor having a source and a drain, one of the source and drain of the second PMOS transistor being coupled to the substrate of the first PMOS transistor, wherein the second PMOS transistor is turned off when a first signal having a voltage level higher than the power supply voltage is provided on the node.

Also in accordance with the present invention, there is provided a buffer circuit operable in a power supply voltage coupled between a first circuit having a first power level and a second circuit having a second power level that includes a node, a driver circuit comprising a first transistor and a pair of stacked transistors, the first transistor having a gate, a source, and a drain, one of the source and the drain of the first transistor being coupled to the node, the stacked transistors comprising a second transistor and a third transistor, a fourth transistor having a source and a drain, one of the source and drain of the fourth transistor being coupled to the gate of the first transistor, the other of the source and drain of the fourth transistor being coupled to the node, wherein the fourth transistor is turned on to provide a first bias to the gate of the first transistor when a first signal having a voltage level higher than the power supply voltage appears at the node and a gate-tracking circuit coupled to the node and the second and third transistors.

Further in accordance with the present invention, there is provided a buffer circuit connectable to receive a power supply voltage that includes a node, a driver circuit coupled to the node comprising at least a first PMOS transistor, the first PMOS transistor having a gate and a substrate, the driver circuit having an on-state and an off-state, a second PMOS transistor having a source and a drain, one of the source and drain of the second PMOS transistor being coupled to the substrate of the first PMOS transistor, wherein the second PMOS transistor is turned off when a first signal having a voltage level higher than the power supply voltage appears at the node, a first part of a tracking circuit coupled to the gate of the first PMOS transistor to provide a first bias to the gate of the first PMOS transistor when the first signal appears at the node, and a second part of a tracking circuit coupled to the gate of the first PMOS transistor to provide a second bias to the gate of the first PMOS transistor when the driver circuit is in the off-state and a second signal having a voltage level no greater than the power supply voltage appears at the node.

Still further in accordance with the present invention, there is provided a system having a plurality of components operating at different voltage levels that includes a first chip including a first circuit, a second chip including a second circuit, a buffer circuit on the first chip having a receive mode and a transmit mode of operation and coupled between the first circuit and the second circuit, wherein the buffer circuit is connectable to a first power supply voltage and the second circuit is connectable to a second power supply voltage, a node coupling the buffer circuit to the second circuit, and a control signal terminal for providing a first control signal to switch the buffer circuit into the transmit mode, in which the buffer circuit receives at least one signal from the first circuit and outputs at least one signal to the second circuit, and for providing a second control signal to switch the buffer circuit into the receive mode, in which the buffer circuit receives at least one signal from the second circuit and outputs at least one signal to the first circuit, wherein the buffer circuit comprises at least a driver circuit.

In one aspect, the driver circuit includes at least a first PMOS transistor having a drain and a substrate. The buffer circuit further includes a second PMOS transistor having a source and a drain, one of the source and drain of the second PMOS transistor being coupled to the substrate of the first PMOS transistor, wherein the second PMOS transistor is turned off when a first signal having a voltage level higher than the power supply voltage appears at the node.

In another aspect, the driver circuit includes a first NMOS transistor and a second NMOS transistor serially coupled to each other, and the inverter has an input terminal coupled to both the first and second NMOS transistors and a drain of the third PMOS transistor and an output terminal coupled to a gate of the third PMOS transistor, and the third PMOS transistor also has a source connectable to the first power supply voltage.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 3:
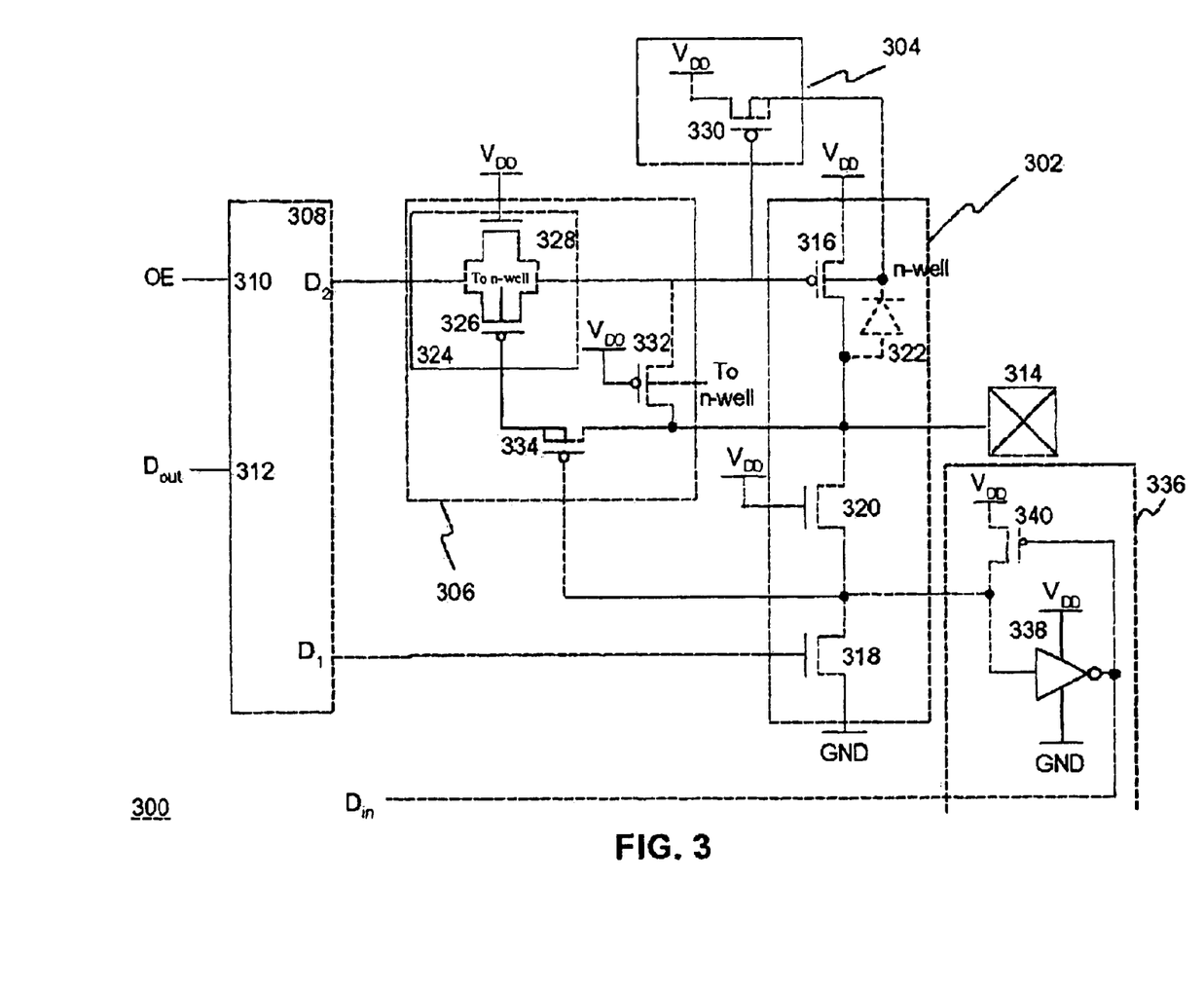
FIG. 3 is a block diagram of an I/O buffer circuit consistent with one embodiment of the present invention.

FIG. 3 is a block diagram of an I/O buffer circuit 300 consistent with one embodiment of the present invention. Referring to FIG. 3, I/O buffer circuit 300 includes a driver circuit 302, a floating well circuit 304, and a gate-tracking circuit 306 coupled between a first circuit (not shown) on a first chip and a second circuit (not shown) on a second chip (not shown) of a mixed-voltage system. Signals are transmitted from the first circuit to the second circuit in the transmit mode and from the second circuit to the first circuit in the receive mode.

For the convenience of explaining the present invention and without limitation on the scope of the present invention, it is assumed that buffer circuit 300 and the first circuit are both connectable to a first power supply voltage $V_{DD}$ at 2.5V, and the second circuit is connectable to a second power supply of 5V. Alternatively, the first and second power supply voltages may also be 1.8V and 3.3V, respectively, or any other pair of voltages encountered in integrated circuit applications. With a power scheme of 2.5V/5V, a signal having a voltage level of about 2.5V is considered a "logic high" signal in the transmit mode, and a signal having a voltage level of about 5V is considered a "logic high" signal in the receive mode. With a power scheme of 1.8V/3.3V, a signal having a voltage level of about 1.8V is considered a "logic high" signal in the transmit mode, and a signal having a voltage level of about 3.3V is considered a "logic high" signal in the receive mode. A "logic low" signal in both the receive and transmit modes can have a voltage level between 0V to a small positive value, but less than the logic level of a "logic high" signal.

Referring to FIG. 3, buffer circuit 300 is coupled to the first circuit through a pre-driver circuit 308, which receives signals from the first circuit at one or more input terminals and outputs one or more signals to driver circuit 302. The input terminals of pre-driver 308 include at least a control signal terminal 310 to receive an output enable signal OE provided from the first circuit, and a data input terminal 312 to receive data signal $D_{out}$. Pre-driver circuit 308 provides at least a first output signal $D_1$ and a second output signal $D_2$.

In operation, output enable signal OE switches buffer circuit 300 between the transmit mode and the receive mode. For example, a logic high OE signal switches buffer circuit 300 into the receive mode and shuts down a path for $D_{out}$ to be transmitted from the first circuit to the second circuit. At the same time, the logic high OE signal opens a path for a signal appearing at a node, or input/output (I/O) pad 314 to be transmitted from the second circuit to the first circuit. A logic low OE signal switches buffer circuit 300 into the transmit mode. A signal appears on bonding pad 314 is an input signal in the receive mode and an output signal in the transmit mode, both of which may have two states, a logic high and a logic low, wherein with a power scheme of 2.5V/5V, the logic high for the transmit mode is about 2.5V, the logic high for the receive mode is about 5V, and the logic low is about 0V.

Driver circuit 302 includes a PMOS transistor 316 and stacked NMOS transistors 318 and 320. Each of PMOS transistor 316 and NMOS transistors 318 and 320 includes a source (not numbered), a drain (not numbered), and a gate (not numbered). PMOS transistor 316 also includes a substrate (not numbered), or n-well, and a parasitic diode 322 between the drain and substrate of PMOS transistor 316. It is generally understood that a MOS transistor is generally symmetrical and the source and drain of the transistors in the above circuit configuration are interchangeable.

Floating well circuit 304 comprises a PMOS transistor 330 having a gate (not numbered), a source (not numbered), a drain (not numbered), and a substrate (not numbered). The gate of PMOS transistor 330 is coupled to the gate of PMOS transistor 316. The source of PMOS transistor 330 is coupled to the substrate of PMOS transistor 330 and also to the substrate of PMOS transistor 316. The drain of PMOS transistor 330 is connectable to $V_{DD}$. Floating well circuit 304 provides different biases to the substrate of PMOS transistor 316, while gate-tracking circuit 306 adjusts a bias on the gate of PMOS transistor 316, thereby turning PMOS transistor 316 on and off. The drain of PMOS transistor 316 is coupled to bonding pad 314, and the source of PMOS transistor 316 is connectable to $V_{DD}$. The gate of PMOS transistor 316 is also coupled to pre-driver 308 through a switch 324 of gate tracking circuit 306 for receiving signal $D_2$.

Gate-tracking circuit 306 includes a first part and a second part, responsive respectively to the conditions when the signal on bonding pad 314 is either a logic high input signal or a logic low input signal. The first part of gate-tracking circuit 306 comprises a PMOS transistor 332. The second part of gate-tracking circuit 306 comprises a PMOS transistor 334 and switch 324. Each of PMOS transistors 332 and 334 includes a substrate (not numbered), a source (not numbered), a drain (not numbered), and a gate (not numbered). The substrate of PMOS transistor 332 is coupled to the substrate, or the n-well, of PMOS transistor 316. The gate of PMOS transistor 332 is connectable to $V_{DD}$. The drain of PMOS transistor 332 is coupled to bonding pad 314, and the source of PMOS transistor 332 is coupled to the gate of PMOS transistor 316. The drain of PMOS transistor 334 is coupled to bonding pad 314, and both the substrate and the source of PMOS transistor 334 are coupled to the gate of a PMOS transistor 326 provided in switch 324. The gate of PMOS transistor 334 is coupled to both the drain of NMOS transistor 318 and the source of NMOS transistor 320.

Switch 324 includes PMOS transistor 326 and an NMOS transistor 328. Switch 324 is turned on when buffer circuit 300 is in the transmit mode. Each of PMOS transistor 326 and NMOS transistor 328 has a gate (not numbered), a source (not numbered), and a drain (not numbered). One of the source and drain of PMOS transistor 326 is coupled to one of the source and drain of NMOS transistor 328 and further coupled to the gate of PMOS transistor 316. The other of the source and drain of PMOS transistor 326 is coupled to the other of the source and drain of NMOS transistor 328 and further coupled to pre-driver 308 to receive signal $D_2$. The gate of NMOS transistor 328 is connectable to $V_{DD}$. PMOS transistor 326 also has a substrate coupled to the n-well.

The gate of NMOS transistor 318 is coupled to pre-driver circuit 308 for receiving signal $D_1$. The source of NMOS transistor 318 is connectable to ground (GND). The drain of NMOS transistor 318 is coupled to the source of NMOS transistor 320. The drain of NMOS transistor 320 is coupled to bonding pad 314 and the drain of PMOS transistor 316. The gate of NMOS transistor 320 is connectable to $V_{DD}$. NMOS transistor 320 provides protection for NMOS transistor 318 such that a high voltage appearing on bonding pad 314 would not damage the gate dielectric of NMOS transistor 318.

Buffer circuit 300 may also comprise an input circuit 336 for receiving the signal on bonding pad 314 and passing an input signal $D_{in}$ (not shown) according to the signal on bonding pad 314. Referring to FIG. 3, input circuit 336 comprises an inverter 338 and a PMOS transistor 340. Inverter 338 includes an input terminal (not numbered) coupled to the drain of NMOS transistor 318 and the source of NMOS transistor 320, and an output terminal (not numbered) coupled to the first circuit. PMOS transistor 340 includes a gate (not numbered) coupled to the output terminal of inverter 338, a source (not numbered) connectable to $V_{DD}$, and a drain (not numbered) coupled to the input terminal of inverter 338.

In the transmit mode, one of transistors 316 and 318 is turned on and driver circuit 302 is therefore turned on to transmit signal to the second circuit. In the receive mode, both transistors 316 and 318 are turned off and driver circuit 302 is turned off. Input circuit 336 receives the signal from the second circuit and transmits the signal to the first circuit. The functions of the circuits of the present invention are further explained in detail below.

A. Transmit Mode, Logic Low Output Signal (0V)

When buffer circuit 300 is in the transmit mode and both $D_1$ and $D_2$ are at 2.5V, both NMOS transistors 318 and 320 are on and bonding pad 314 is at 0V. The gate of PMOS transistor 316 is first biased at about $V_{DD}$-$V_{thn}$, wherein $V_{thn}$ is the threshold voltage of NMOS transistor 328. However, with its drain coupled to bonding pad 314, and the gate coupled to the drain of transistor 318, both the drain and gate of PMOS transistor 334 are biased at 0V. Accordingly, the source of PMOS transistor 334 has a voltage level of about $|V_{thp}|$, wherein $V_{thp}$ is the threshold of PMOS transistor 334. Therefore, the gate of PMOS transistor 326 is biased at $|V_{thp}|$, and is turned on to pass $D_2$ to the gate of PMOS transistor 316 to fully turn off PMOS transistor 316. There is no leakage current through PMOS transistor 316 or its parasitic diode 322 to $V_{DD}$.

B. Transmit Mode, Logic High Output Signal (2.5V)

When buffer circuit 300 is in the transmit mode and both $D_1$ and $D_2$ are 0V, NMOS transistor 318 is off, and NMOS transistor 328 is turned on to bias PMOS transistor 316 at 0V. Therefore, PMOS transistor 316 is turned on and bonding pad 314 has a voltage level of $V_{DD}$, or 2.5V. Since the gate of PMOS transistor 330 is biased at 0V, PMOS transistor 330 is turned on and therefore the substrate of PMOS transistor 316 is also at 2.5V. Again, there is no leakage current through parasitic diode 322 to $V_{DD}$, and the gate-to-source and gate-to-drain biases are both at 2.5V.

C. Receive Mode, Logic High Input Signal (5V)

In the receive mode, $D_1$ is at 0V and $D_2$ is at 2.5V. NMOS transistor 318 is turned off. When the signal on bonding pad 314 is at a logic high, i.e., 5V, PMOS transistor 332 is turned on to bias the gate of PMOS transistor 316 at 5V. Therefore, PMOS transistor 316 is turned off and its gate-to-drain bias is approximately 0V and its gate-to-source bias is approximately 2.5V.

At the same time, because the gate of PMOS transistor 330 is biased at 5V also, PMOS transistor 330 is turned off. The substrate of PMOS transistor 316 follows the voltage on bonding pad 314 because of the drain-to-substrate parasitic diode 322. Therefore, the voltage at substrate of PMOS transistor 316 is also approximately 5V. As a result, there is no leakage current through PMOS transistor 316 to $V_{DD}$ because the source-substrate junction of PMOS transistor 316 is reverse-biased.

For PMOS transistor 334, the gate is coupled to the drain of PMOS transistor 340 and is kept at approximately $V_{DD}$, i.e., 2.5V. Therefore, PMOS transistor 334 is turned on and the gate of PMOS transistor 326 is also biased at 5V. Input circuit 336 receives the 2.5V signal at the drain of PMOS transistor 340, which is a logic high to the first circuit.

D. Receive Mode, Logic Low Input Signal (0V)

Similar to the case when buffer circuit 300 is in the transmit mode and outputs a logic low output (0V), as discussed in Section A above, a 0V signal on bonding pad 314 will turn on NMOS transistor 320 and PMOS transistor 326, and the gate of PMOS transistor 316 is biased at 2.5V. Therefore, PMOS transistor 316 is fully turned off, and there is no leakage current through parasitic diode 322 to $V_{DD}$. Also, since NMOS transistor 320 is turned on, the source is biased at 0V also. Therefore, a logic low signal is provided to the first circuit by way of input circuit 336.

E. Simulation Results

Figure 4:
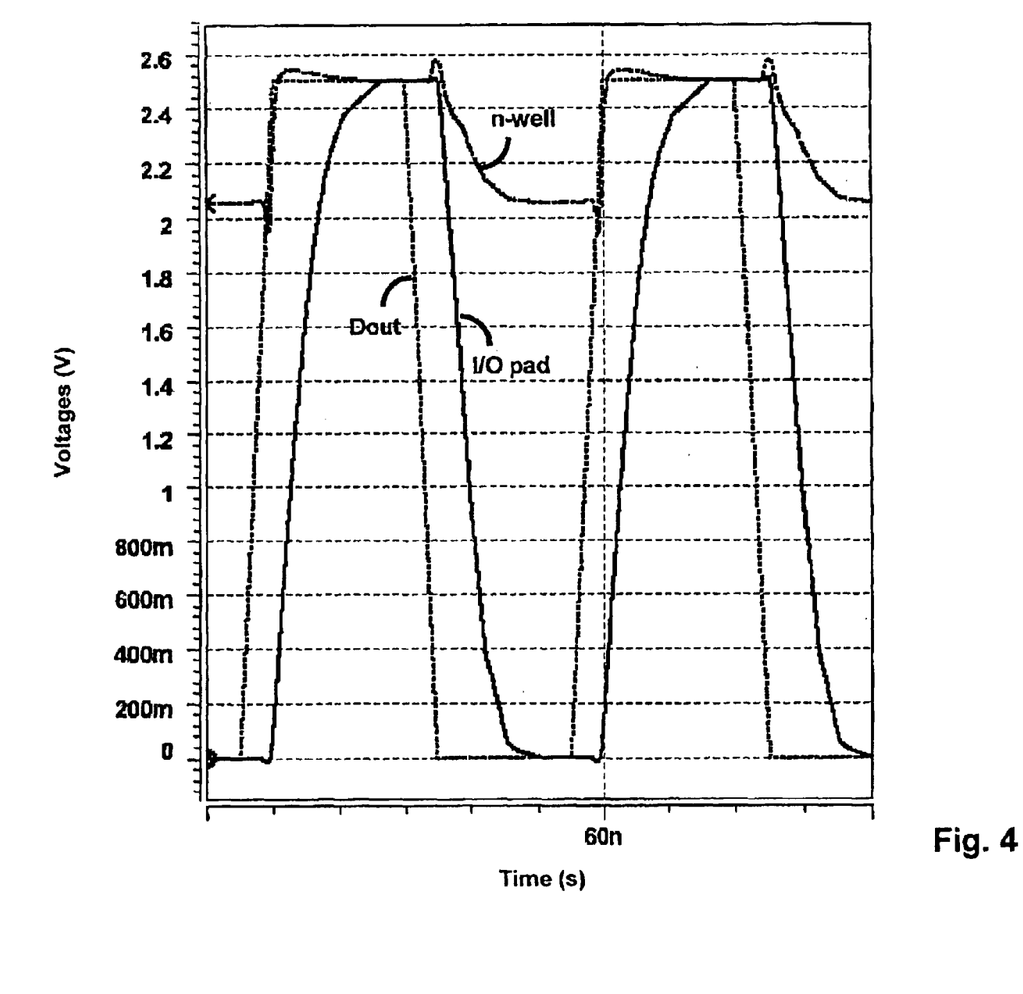
FIG. 4 is a chart showing a simulation result of the I/O buffer circuit shown in FIG. 3.
Figure 5A:
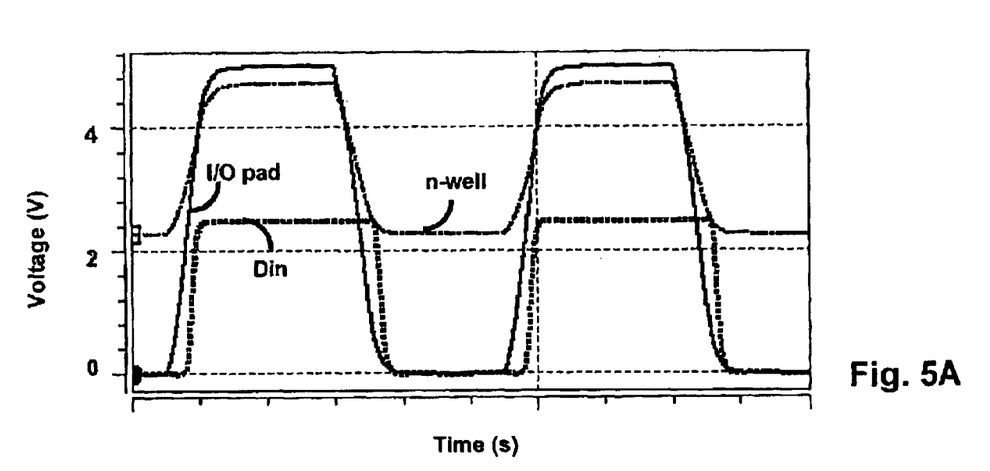
FIGS. 5A and 5B show another simulation result of the I/O buffer circuit shown in FIG. 3.
Figure 5B:
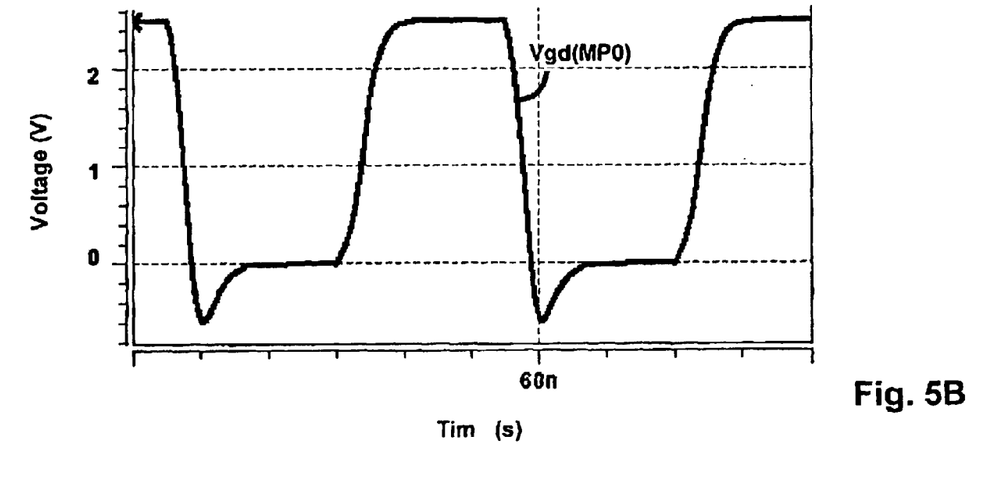

FIGS. 4 and 5 show simulation results for operation of buffer circuit 300.

FIG. 4 graphically illustrates a simulation result of the substrate bias of PMOS transistor 316 with respect to $D_{out}$ when buffer circuit 300 is in the transmit mode. In the simulation, both $D_1$ and $D_2$ are buffered $D_{out}$, i.e., they have the same voltage level as $D_{out}$. The first power supply voltage is assumed to be 2.5V. As shown in FIG. 4, the substrate bias of PMOS transistor 316 falls within the range of about between 2.1 to 2.6V, and the difference between the substrate bias and the voltage on I/O pad 314 is no more than about 2.5V.

FIGS. 5A and 5B illustrate another simulation result of the gate-to-drain bias ($V_{gd}$), the substrate bias, or n-well bias, of PMOS transistor 316 and the input signal $D_{in}$ in the receive mode as the signal on bonding pad 314 changes with time. FIG. 5A shows the voltage on I/O pad 314, the voltage level of n-well, and the voltage level of input signal $D_{in}$, versus time. FIG. 5B shows the corresponding gate-to-drain bias $V_{gd}$ versus time during the same time frame as that of FIG. 5A. As shown in FIGS. 5A and 5B, the n-well bias of PMOS transistor 316 is very close to the voltage on I/O pad 314 when the voltage on I/O pad 314 exceeds about 2.5V, and the gate-to-drain bias $V_{gd}$ is always below about 2.5V.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A buffer circuit in a mixed-voltage circuit operating in a power supply voltage, comprising:

a node;

a driver circuit coupled to the node comprising at least a first PMOS transistor having a substrate, a drain, a source, and a parasitic diode between the drain and the substrate, the driver circuit having an on-state and an off-state and further comprising a pair of stacked transistors;

a second PMOS transistor having a source and a drain, one of the source and drain of the second PMOS transistor being coupled to the substrate of the first PMOS transistor, wherein the second PMOS transistor is turned off when a first signal having a voltage level higher than the power supply voltage is provided on the node; and a gate-tracking circuit coupled to the node, and having a transistor whose gate is directly connected to each of the pair of stacked transistors.

2. The circuit of claim 1, wherein a voltage at the substrate of the first PMOS transistor has a level substantially equal to that of the first signal when the first signal appears on the node.

3. The circuit of claim 1, wherein the second PMOS transistor has a gate and a substrate, the gate of the second PMOS transistor being coupled to the gate of the first PMOS transistor, the substrate of the second PMOS transistor being coupled to the substrate of the first PMOS transistor, and the other of the drain and source of the second PMOS transistor being connectable to receive the power supply voltage.

4. The circuit of claim 1, wherein the second PMOS transistor is turned on when the driver circuit operates in the on-state and a voltage at the node is approximately equal to the power supply voltage.

5. The circuit of claim 1, wherein the pair of stacked transistors further comprises two stacked NMOS transistors serially coupled to the first PMOS transistor, all of the first PMOS transistor and the two stacked NMOS transistors being off when the driver circuit is in the off state, and one of the first PMOS transistor or both of the two stacked NMOS transistors being on when the driver circuit is in the on state.

6. A buffer circuit operable in a power supply voltage coupled between a first circuit having a first power level and a second circuit having a second power level, comprising:

a node;

a driver circuit comprising a first transistor and a pair of stacked transistors, the first transistor having a gate, a source, and a drain, one of the source and the drain of the first transistor being coupled to the node, the stacked transistors comprising a second transistor and a third transistor;

a fourth transistor having a source and a drain, one of the source and drain of the fourth transistor being coupled to the gate of the first transistor, the other of the source and drain of the fourth transistor being coupled to the node, wherein the fourth transistor is turned on to provide a first bias to the gate of the first transistor when a first signal having a voltage level higher than the power supply voltage appears at the node; and a gate-tracking circuit coupled to the node, and having a transistor whose gate is directly connected to the second and third transistors.

7. The circuit of claim 6, wherein the gate-tracking circuit comprises a fifth transistor having a source, a drain, and a gate, one of the source and drain of the fifth transistor being coupled to the node, and the gate of the fifth transistor being coupled to both the second and third transistors.

8. The circuit of claim 7, wherein the fifth transistor is turned on when the first signal appears at the node.

9. The circuit of claim 6, wherein the fourth transistor has a substrate coupled to the substrate of the first transistor and a gate connectable to receive the power supply voltage.

10. The circuit of claim 6, wherein the first bias has a voltage level approximately equal to that of the first signal.

11. The circuit of claim 6, wherein the gate-tracking circuit further comprising a switch, wherein the switch is turned on when the buffer circuit is in a transmit mode.

12. The circuit of claim 11, wherein the switch includes a sixth transistor and a seventh transistor, each having a source, a drain, and a gate, one of the source and drain of the sixth transistor and one of the source and drain of the seventh transistor being coupled to the gate of the first transistor, the gate of the sixth transistor being connectable to receive the power supply voltage, and the gate of the seventh transistor being coupled to the other of the source and drain of the fifth transistor.

13. The circuit of claim 12, wherein the seventh transistor is turned on when a second signal having a voltage level lower than the power supply voltage appears at the node.

14. A buffer circuit connectable to receive a power supply voltage, comprising:

a node;

a driver circuit coupled to the node comprising at least a first PMOS transistor, the first PMOS transistor having a gate and a substrate, the driver circuit having an on-state and an off-state and further comprising a pair of stacked transistors;

a second PMOS transistor having a source and a drain, one of the source and drain of the second PMOS transistor being coupled to the substrate of the first PMOS transistor, wherein the second PMOS transistor is turned off when a first signal having a voltage level higher than the power supply voltage appears at the node;

a first part of a tracking circuit coupled to the gate of the first PMOS transistor to provide a first bias to the gate of the first PMOS transistor when the first signal appears at the node; and a second part of the tracking circuit coupled to the gate of the first PMOS transistor to provide a second bias to the gate of the first PMOS transistor when the driver circuit is in the off-state and a second signal having a voltage level no greater than the power supply voltage appears at the node, wherein the second part of the tracking circuit is directly connected to each of the pair of stacked transistors.

15. The circuit of claim 14, wherein the pair of stacked transistors comprises a pair of stacked NMOS transistors coupled to the first PMOS transistor.

16. The circuit of claim 14, wherein the voltage at the substrate of the first PMOS transistor is approximately equal to the voltage level of the first signal when the first signal appears at the node.

17. The circuit of claim 14, wherein the first bias has a voltage level approximately equal to the voltage level of the first signal.

18. The circuit of claim 14, wherein the second bias has a voltage level approximately equal to the power supply voltage.

19. The circuit of claim 14, wherein the first part of the tracking circuit comprises a third PMOS transistor having a gate, a source, a drain, and a substrate, the gate of the third PMOS transistor is connectable to receive the power supply voltage, one of the source and drain of the third PMOS transistor is coupled to the node, the other of the source and drain of the third PMOS transistor is coupled to the gate of the first PMOS transistor, and the substrate of the third PMOS transistor is coupled to the substrate of the first PMOS transistor.

20. The circuit of claim 19, wherein the third PMOS transistor is turned on when the first signal appears at the node.

21. The circuit of claim 14, wherein the second part of the tracking circuit comprises a third PMOS transistor having a gate, a source, a drain, and a substrate, and the pair of stacked transistors comprise a first NMOS transistor and a second NMOS transistor, and wherein the gate of the third PMOS transistor is coupled to both the first and second NMOS transistors and one of the source and drain of the third PMOS transistor is coupled to the node.

22. The circuit of claim 21, wherein the third PMOS transistor is turned on when the first signal appears at the node.

23. The circuit of claim 21, wherein the second part of the tracking circuit further comprises a switch having a third NMOS transistor and a fourth PMOS transistor coupled in parallel, each of the third NMOS transistor and the fourth PMOS transistor having a gate, a source, and a drain, and wherein the gate of the third NMOS transistor is connectable to receive the power supply voltage, the gate of the fourth PMOS transistor is coupled to both the substrate and the other of the source and drain of the third PMOS transistor, one of the source and drain of the third NMOS transistor is coupled to one of the source and drain of the fourth PMOS transistor, and the other of the source and drain of the third NMOS transistor is coupled to the other of the source and drain of the fourth PMOS transistor and further coupled to the gate of the first PMOS transistor.

24. The circuit of claim 23, wherein the fourth PMOS transistor is turned off when the first signal appears at the node.

25. A system having a plurality of components operating at different voltage levels, comprising:

a first chip including a first circuit;

a second chip including a second circuit;

a buffer circuit on the first chip having a receive mode and a transmit mode of operation and coupled between the first circuit and the second circuit, wherein the buffer circuit is connectable to a first power supply voltage and the second circuit is connectable to a second power supply voltage;

a node coupling the buffer circuit to the second circuit; and a control signal terminal for providing a first control signal to switch the buffer circuit into the transmit mode, in which the buffer circuit receives at least one signal from the first circuit and outputs at least one signal to the second circuit, and for providing a second control signal to switch the buffer circuit into the receive mode, in which the buffer circuit receives at least one signal from the second circuit and outputs at least one signal to the first circuit, wherein the buffer circuit comprises:

a driver circuit that contains a pair of stacked transistors and a first PMOS transistor having a gate, drain and a substrate, and a tracking circuit directly connected to the gate of the first PMOS transistor and to each of the stacked transistors.

26. The system of claim 25, wherein the buffer circuit further comprises a second PMOS transistor having a source and a drain, one of the source and drain of the second PMOS transistor being coupled to the substrate of the first PMOS transistor, wherein the second PMOS transistor is turned off when a first signal having a voltage level higher than the power supply voltage appears at the node.

27. The system of claim 26, wherein the tracking circuit further comprises, a first part of the tracking circuit coupled to the gate of the first PMOS transistor to provide a first bias to the gate of the first PMOS transistor when the first signal appears at the node, wherein the first bias has a voltage level approximately equal to the voltage level of the first signal, and a second part of the tracking circuit coupled to the gate of the first PMOS transistor to provide a second bias to the gate of the first PMOS transistor when a second signal having a voltage level lower than the first power supply voltage appears at the node, wherein the second bias has a voltage level approximately equal to the first power supply voltage in the receive mode.

28. The system of claim 27, wherein the first part of the tracking circuit comprises a third PMOS transistor having a gate, a source, a drain, and a substrate, and wherein the gate of the third PMOS transistor is connectable to the first power supply voltage, one of the source and drain of the third PMOS transistor is coupled to the node, the other of the source and the drain of the third PMOS transistor is coupled to the gate of the first PMOS transistor, and the substrate of the third PMOS transistor is coupled to the substrate of the first PMOS transistor.

29. The system of claim 27, wherein the second part of the tracking circuit comprises a third PMOS transistor having a gate, a source, a drain, and a substrate, and the pair of stacked transistors comprises a first NMOS transistor and a second NMOS transistor, and wherein the gate of the third PMOS transistor is coupled to both the first and second NMOS transistors, and one of the source and drain of the third PMOS transistor is coupled to the node.

30. The system of claim 29, wherein the second part of the tracking circuit further comprises a switch having a third NMOS transistor and a fourth PMOS transistor coupled to each other in parallel, each of the third NMOS transistor and the fourth PMOS transistor having a gate, a source, and a drain, and wherein the gate of the third NMOS transistor is connectable to the power supply voltage, the gate of the fourth PMOS transistor is coupled to both the substrate and the other of the source and drain of the third PMOS transistor, one of the source and drain of the third NMOS transistor is coupled to one of the source and drain of the fourth PMOS transistor, and the other of the source and drain of the third NMOS transistor is coupled to the other of the source and drain of the fourth PMOS transistor and further coupled to the gate of the first PMOS transistor.

31. The system of claim 25, wherein the first power supply voltage is lower than the second power supply voltage.

32. The system of claim 25, wherein the driver circuit is turned on in the transmit mode and turned off in the receive mode.

33. The system of claim 25, wherein the buffer circuit further comprises an input circuit for receiving at least one signal from the second circuit and outputting at least one signal to the first circuit.

34. The system of claim 33, wherein the input circuit includes an inverter and a third PMOS transistor.

35. The system of claim 34, the driver circuit of the pair of stacked transistors comprises a first NMOS transistor and a second NMOS transistor serially coupled to each other, and wherein the inverter has an input terminal coupled to both the first and second NMOS transistors and a drain of the third PMOS transistor and an output terminal coupled to a gate of the third PMOS transistor, and the third PMOS transistor also has a source connectable to the first power supply voltage.

* * * * *